United States Patent [19]

Shibata et al.

[11] Patent Number: 4,916,084
[45] Date of Patent: Apr. 10, 1990

[54] METHOD FOR MANUFACTURING MOS SEMICONDUCTOR DEVICES

[75] Inventors: Hideki Shibata; Mitsuchika Saitoh, both of Yokohama, Japan

[73] Assignee: Kabushiki Kaisha Toshiba, Kawasaki, Japan

[21] Appl. No.: 217,787

[22] Filed: Jul. 12, 1988

[30] Foreign Application Priority Data

Jul. 13, 1987 [JP] Japan ................................. 62-174119

[51] Int. Cl.$^4$ ........................................... H01L 21/265
[52] U.S. Cl. ......................................... 437/41; 437/43; 437/49; 437/192; 437/194
[58] Field of Search ...................... 437/41, 43, 49, 192, 437/193

[56] References Cited

U.S. PATENT DOCUMENTS 4,378,628  4/1983  Levinstein ............................. 437/41
4,488,348  12/1984  Jolly ..................................... 437/41

FOREIGN PATENT DOCUMENTS 88339    7/1981  Japan .................................... 437/192
183942   8/1986  Japan .................................... 437/192
2162999  2/1986  United Kingdom .

Primary Examiner—Brian E. Hearn
Assistant Examiner—Tuan Nguyen
Attorney, Agent, or Firm—Finnegan, Henderson, Farabow, Garrett & Dunner

[57] ABSTRACT

A method for manufacturing MOS semiconductor devices comprises the steps of forming a oxidation resistant film on the upper and side surfaces of a gate electrode which is formed on a silicon substrate via an oxide film and whose upper and side surfaces are coated with an insulation oxide film, effecting thermal oxidation with the oxidation resistant film as a mask, removing the oxidation resistant film and the oxide film lying directly under the oxidation resistant film to expose the surface of the substrate, doping impurity into the exposed surface area of the substrate to form impurity regions, forming a silicon layer on the exposed surface of the substrate by a growth process, forming a first refractory metal layer on the entire surface of the structure, forming an insulation film on the first refractory metal layer, selectively removing the insulation film to form a contact hole, forming a second refractory metal layer in the contact hole by a deposition process, removing the insulation film and the first refractory metal layer except that part thereof which lies directly under the second refractory metal layer, depositiong an interlayer insulation film on the entire surface of the structure, planarizing the surface of the interlayer insulation film and then etching back the interlayer insulation film to expose the surface of the second refractory metal layer, and forming a metal wiring layer on the exposed surface of the second refractory metal layer.

6 Claims, 2 Drawing Sheets

METHOD FOR MANUFACTURING MOS SEMICONDUCTOR DEVICES

BACKGROUND OF THE INVENTION

1. Field of the Invention

This invention relates to a method for manufacturing MOS semiconductor devices, and more particularly to a self-alignment process for forming contact electrodes.

2. Description of the Related Art

Recently, semiconductor elements have been made smaller in size. However, the alignment tolerance required when a self-alignment process is effected for forming MOS transistors makes it difficult to attain the fine semiconductor elements. It is necessary to provide such an alignment tolerance when the limited processing precision and mask alignment precision of an exposure device are taken into consideration.

FIG. 1 shows the cross section of a MOS transistor to illustrate the alignment tolerance. As is clearly shown in FIG. 1, distance L1 is provided between gate electrode 1 and contact holes 4 and 5 formed in the source and drain regions of the MOS transistor and distance L2 is provided between contact holes 4 and 5 and element isolation region 6 as the alignment tolerance.

If contact holes 4 and 5 are formed without providing the alignment tolerance and when mask displacement occurs, then gate electrode 1 may be short-circuited with contact electrodes 7 and 8 which are formed in contact holes 4 and 5 and contact holes 4 and 5 may be formed on element isolation region 6 to cause the contact electrodes to be electrically connected with the substrate.

SUMMARY OF THE INVENTION

The object of this invention is to provide a method for manufacturing MOS semiconductor devices in which high yield contact electrodes can be formed without producing an alignment tolerance between the gate electrode and the contact holes and between the contact holes and the element isolation region.

This objective can be attained by a method for manufacturing MOS semiconductor devices which comprises the steps of forming an oxidation resistant film on both the upper and side surfaces of a gate electrode which is formed on a semiconductor substrate via an oxide film and whose upper and side surfaces are coated with an insulation oxide film; effecting thermal oxidation by using the oxidation resistant film as a mask; removing the oxidation resistant film and the oxide film lying directly under the oxidation resistant film to expose the surface of the semiconductor substrate; doping an impurity into the exposed surface area of the semiconductor substrate to form impurity regions serving as source and drain regions; forming a semiconductor layer on the exposed surface of the semiconductor substrate through a growth process; forming a first refractory metal layer on the entire surface of the semiconductor structure; forming an insulation film on the first refractory metal layer; selectively removing the insulation film to form at least one contact hole; forming a second refractory metal layer in the contact hole through a deposition process; removing the insulation film and the first refractory metal layer except that part thereof which lies directly under the second refractory metal layer; depositing an interlayer insulation film on the entire surface of the semiconductor structure; and planarizing the surface of the interlayer insulation film and then etching back the interlayer insulation film to expose the surface of the second refractory metal layer.

DETAILED DESCRIPTION OF THE PREFERRED EMBODIMENTS

There will now be described a manufacturing method for forming a MOS semiconductor device according to one embodiment of this invention with reference to FIGS. 2A and 2H.

Figure 1:
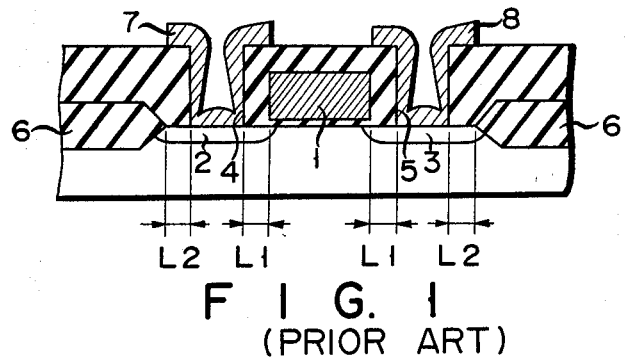
FIG. 1 is a cross sectional view of a MOS semiconductor device formed according to the conventional manufacturing method.
Figure 2A:
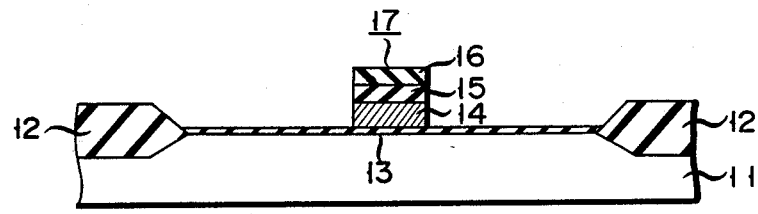
FIGS. 2A and 2H are cross sectional views showing the manufacturing method for forming a MOS semiconductor device according to the embodiment of this invention.

As shown in FIG. 2A, field oxide film 12 is formed as an element isolation region on silicon substrate 11, and then a thermal oxidation process is effected to form gate oxide film 13 with a thickness of 100 to 160 Å. Next, polysilicon layer 14 (or metal silicide layer) having phosphor doped therein is formed to a thickness of 2500 Å. Then, CVD oxide film 15 with a thickness of 1000 to 2000 Å and oxidation resistant film 16 such as silicon nitride film ($Si_3N_4$) with a thickness of 1000 to 1500 Å are formed in this order by deposition technique on polysilicon layer 14. After this, a patterning process is effected to form gate electrode section 17 as shown in FIG. 2A.

Figure 2B:
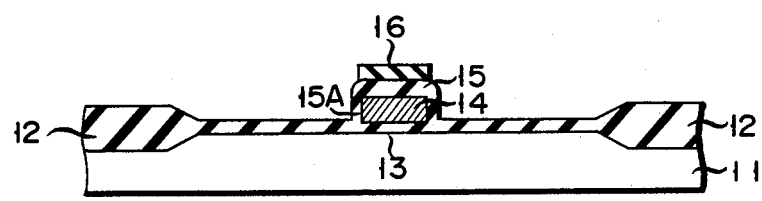
Figure 2C:
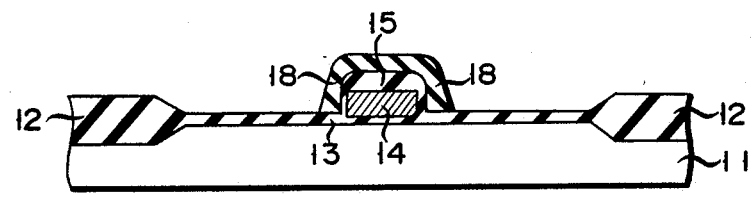
Figure 2D:
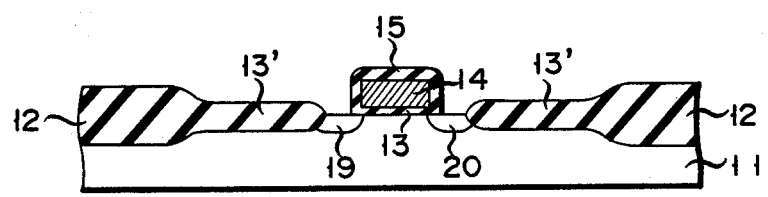

Next, as shown in FIG. 2B, a thermal oxidation process is effected to form oxide film 15A to a thickness of 100 to 300 Å on the side surface of polysilicon layer 14, thus insulating polysilicon layer 14 serving as a gate electrode by means of films 15, 15A and 16. Then, a silicon nitride film with a thickness of approx. 3500 Å is formed on the entire surface of the semiconductor structure, and an anisotropic process such as RIE method is effected to form silicon nitride film 18 on the upper and side surfaces of the gate electrode section as shown in FIG. 2C. After this, a thermal oxidation process is effected at a temperature of 900° to 950° C. in an atmosphere of ($H_2+O_2$) with silicon nitride film 18 as a mask so as to make exposed oxide films 12 and 13' thicker than the oxide film lying directly under silicon nitride film 18. In this condition, an etching-back process is effected to remove silicon nitride film 18 and the oxide film lying under film 18 so as to expose part of silicon substrate 11 which corresponds in position to silicon nitride film 18 as shown in FIG. 2D. In this case, since oxide films 12 and 13' are formed thicker than the oxide film lying directly under silicon nitride film 18 as described before, the surface of polysilicon layer 14 and the remaining portion of silicon substrate 11 which lies outside silicon nitride film 18 will not be exposed. After this, impurity is ion-implanted into the exposed surface area of silicon substrate 11 with oxide films 12 and 13' as a mask to form impurity regions 19 and 20 serving as source and drain regions.

Figure 2E:
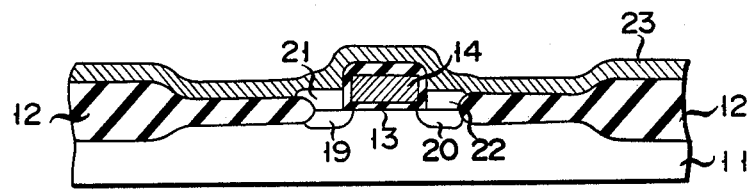

Then, as shown in FIG. 2E, silicon layers 21 and 22 are formed to a thickness of approx. 2000 Å on the exposed surface of silicon substrate 11 by a selective epitaxial growth method. First refractory metal layer 23 is formed by depositing titanium (Ti) and titanium nitride (TiN) to respective thicknesses of 100 to 200 Å and 500 to 1000 Å by a sputtering method on the planarized surface due to formation of silicon layers 21 and 22.

Figure 2F:
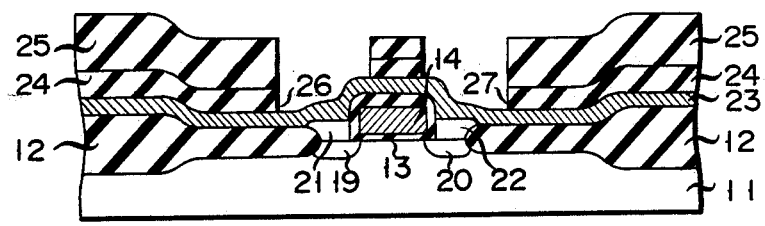

Next, as shown in FIG. 2F, CVD oxide film 24 and BPSG film 25 are formed to respective thicknesses of approx. 2000 Å and 8000 Å, and then the surface is planarized by a low temperature reflow process at a temperature of 600° to 800° C. After this, CVD oxide film 24 and BPSG film 25 are selectively etched away to form contact holes 26 and 27. In this case, refractory metal layers 23 acts as an etching stopper so as to prevent the contact holes from being formed in field oxide film 12 and polysilicon layer 14 serving as a gate electrode.

Figure 2G:
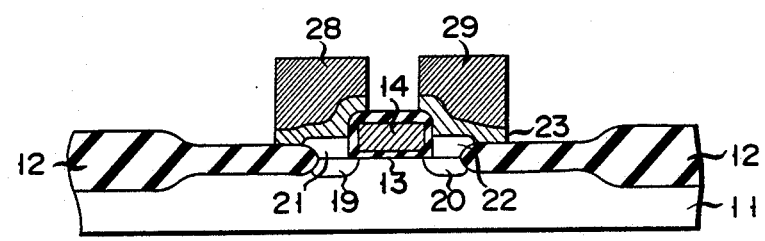

Then, as shown in FIG. 2G, tungsten (W) is selectively deposited in contact holes 26 and 27 by a CVD method to form second refractory metal layers 28 and 29, and BPSG film 25, CVD oxide film 24 and first refractory metal layer 23 are selectively removed by an RIE method to leave only those portions of first refractory metal layer 23 which lie directly under second refractory metal layers 28 and 29.

Figure 2H:
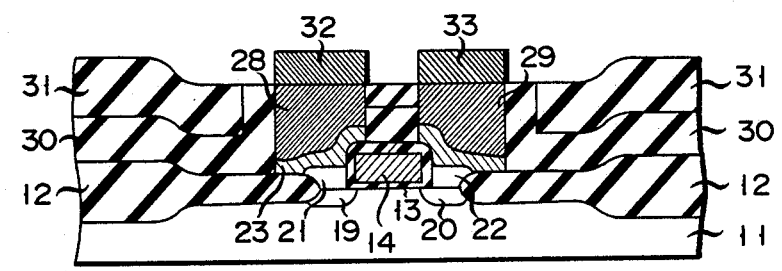

Next, as shown in FIG. 2H, CVD film 30 and BPSG film 31 are formed to respective thicknesses of 2000 Å and 8000 Å, and the surface thereof is planarized and etched back to expose the surface of second refractory metal layers 28 and 29 in a low temperature reflow process at a temperature of 600° to 800° C. Then, aluminum wiring layers 32 and 33 are formed on second refractory metal layers 28 and 29.

In the embodiment described above, the ion-implantation process for forming impurity regions 19 and 20 is effected prior to the formation of silicon layers 21 and 22. However, it is possible to effect the process after the formation of silicon layers 21 and 22. Further, it is possible to dope impurity at a low impurity concentration prior to the formation of silicon layers 21 and 22 and dope impurity at a high impurity concentration after the formation of silicon layers 21 and 22 so as to obtain an LDD structure.

Since the thickness of thin oxide film 13 formed on substrate 11 is increased in the succeeding thermal oxidation step as shown in FIG. 2D, element isolation can be attained without previously forming thick field oxide film 12.

As described above, according to the manufacturing method of this invention, the etching stopper which is used as an stopper at the time of formation of the contact hole is formed on the gate electrode and element isolation region so that the gate electrode will not electrically connected with the contact electrode even if the contact hole is formed with an alignment error. Therefore, the contact electrode can be formed with a high yield without providing the alignment tolerance between the gate electrode and contact hole and between the contact hole and the element isolation region, thus making it possible to form fine MOS transistors. Further, the diffusion area for the source and drain regions can be reduced so that the junction capacitance can be reduced, enhancing the operation speed of the MOS transistor.

What is claimed is:

1. A method for manufacturing MOS semiconductor devices which comprises the steps of:
    forming an oxidation resistant film on the upper and side surfaces of a gate electrode which is formed on a semiconductor substrate via an oxide film and whose upper and side surfaces are coated with an insulation oxide film;
    effecting thermal oxidation with said oxidation resistant film as a mask;
    removing said oxidation resistant film and part of said oxide film lying directly under said oxidation resistant film to selectively expose the surface of said semiconductor substrate;
    doping impurity into the exposed surface area of said semiconductor substrate to form impurity regions serving as source and drain regions;
    forming a semiconductor layer on the exposed surface of said semiconductor substrate by a growth process;
    forming a first refractory metal layer on the entire surface of the semiconductor structure;
    forming an insulation film on said first refractory metal layer;
    selectively removing said insulation film to form at least one contact hole;
    forming a second refractory metal layer in said contact hole by a deposition process;
    removing said insulation film and said first refractory metal layer except that part thereof which lies directly under said second refractory metal layer; and
    depositing an interlayer insulation film on the entire surface of the semiconductor structure, and planarizing the surface of said interlayer insulation film to expose the surface of said second refractory metal layer.

2. A method for manufacturing MOS semiconductor devices according to clam 1, wherein the step of forming said semiconductor region is effected prior to the step of forming said semiconductor layer.

3. A method for manufacturing MOS semiconductor devices according to claim 1, wherein the step of forming said semiconductor region is effected after the step of forming said semiconductor layer.

4. A method for manufacturing MOS semiconductor devices according to claim 1, wherein said first refractory metal layer is formed of a laminated structure of a titanium layer and a titanium nitride layer.

5. A method for manufacturing MOS semiconductor devices according to claim 1, wherein said second refractory metal layer is formed of a tungsten layer.

6. A method for manufacturing MOS semiconductor devices according to claim 1, wherein said semiconductor layer is a silicon layer which is formed by a selective epitaxial growth method.

* * * * *